United States Patent [19]

Sambrook

[11] 3,963,425
[45] June 15, 1976

[54] COMPOSITE MATERIALS
[75] Inventor: David John Sambrook, Warley, England
[73] Assignee: Imperial Metal Industries (Kynoch) Limited, England
[22] Filed: Sept. 20, 1974
[21] Appl. No.: 507,993

Related U.S. Application Data

[63] Continuation of Ser. No. 242,368, April 10, 1972, abandoned.

[30] Foreign Application Priority Data
Apr. 15, 1971 United Kingdom............. 9496/71
Feb. 17, 1972 United Kingdom............. 7427/72

[52] U.S. Cl............................ 29/191.4; 29/191.6; 174/128 S
[51] Int. Cl.$^2$................ B21C 37/00; B21F 19/00; B23P 3/00
[58] Field of Search............... 29/191.6, 191.4, 599; 174/DIG. 6, 15 C, 126 CP, 126 S, 128 S; 335/216

[56] References Cited
UNITED STATES PATENTS

| 3,331,041 | 7/1967 | Bogner............. 174/DIG. 6 |
| 3,366,728 | 1/1968 | Garwin et al............. 335/216 UX |
| 3,514,850 | 6/1970 | Barber et al............. 29/599 |
| 3,625,662 | 12/1971 | Roberts et al............. 29/191.6 |
| 3,710,000 | 1/1973 | Shattes et al............. 335/216 X |
| 3,730,967 | 5/1973 | Nicol............. 174/15 C |

Primary Examiner—L. Dewayne Rutledge
Assistant Examiner—Michael L. Lewis
Attorney, Agent, or Firm—Cushman, Darby & Cushman

[57] ABSTRACT

A superconductor composite comprising at least one longitudinally extending superconductor filament or bundle of sub-filaments, each filament or bundle of sub-filaments being surrounded by and in good electrical contact with a matrix material, the matrix material comprising a plurality of longitudinally extending cells of a metal of high electrical conductivity surrounded by a material of lower electrical conductivity, the high electrical conductivity material surrounding the at least one superconducting filament or bundle of sub-filaments being interrupted by a radially extending wall of the material of the lower electrical conductivity, the arrangement being such that where at least two superconductor filaments or sub-filaments are circumferentially circumscribed by a single annulus of the material of high electrical conductivity, the annulus is electrically interrupted by a radially extending wall of the material of low electrical conductivity.

8 Claims, 9 Drawing Figures

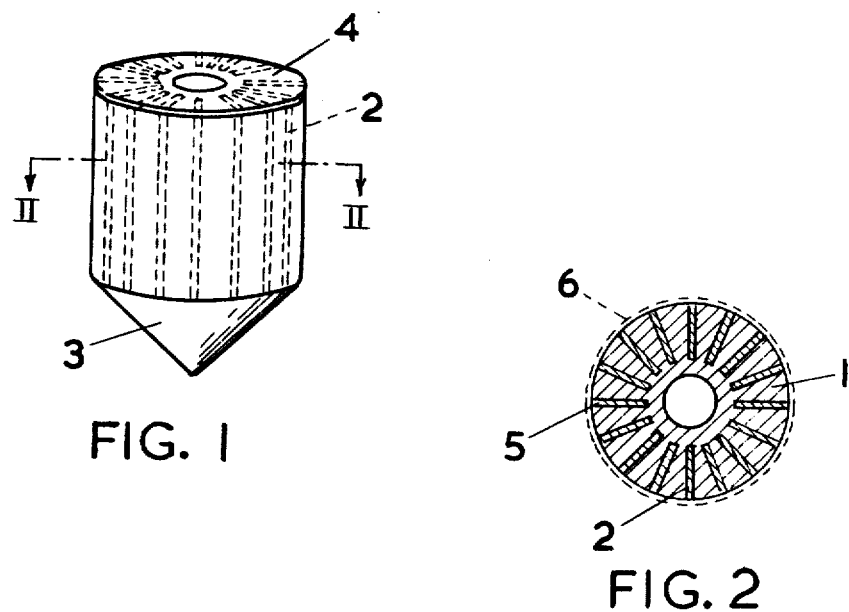
FIG. 1
FIG. 2
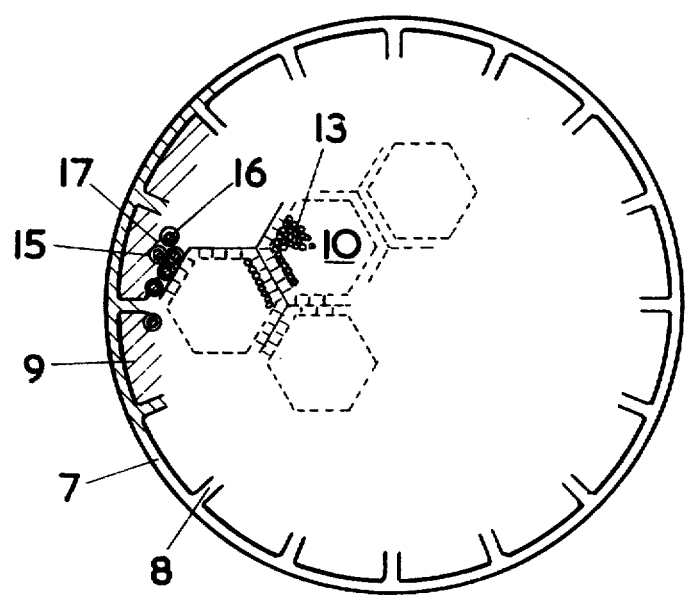
FIG. 3

COMPOSITE MATERIALS

This is a continuation of application Ser. No. 242,368, filed Apr. 10, 1972.

BACKGROUND OF THE INVENTION

This invention relates to composite materials and methods of manufacture thereof. The invention is particularly concerned with composite materials including filaments of superconductive material and methods of manufacture thereof.

SUMMARY OF THE INVENTION

By the present invention there is provided a superconductor composite comprising at least one longitudinally extending superconductor filament or bundle of filaments, each filament or bundle of filaments being surrounded by and in good electrical contact with a matrix material, the matrix material comprising a plurality of longitudinally extending cells of a metal of high electrical conductivity surrounded by a material of lower electrical conductivity, the high electrical conductivity material surrounding the at least one superconducting filament or bundle of filaments being interrupted by a radially extending wall of the material of the lower electrical conductivity, the arrangement being such that where at least two superconductor filaments or filaments are circumferentially circumscribed by a single annulus of the material of high electrical conductivity, the annulus is electrically interrupted by a radially extending wall of the material of low electrical conductivity.

At least some of the filaments in a bundle may be individually by completely surrounded by an annular cell of the material of high electrical conductivity, with material of the lower electrical conductivity completely circumferentially surrounding the annular cell of the material of high electrical conductivity. The material of lower electrical conductivity is preferably a metal. Preferably there is a plurality of filaments or bundles of filaments.

The present invention also provides a composite material comprising at least one superconductor filament of superconductive material in good electrical contact with and embedded in a matrix material, the matrix material comprising a plurality of longitudinally extending low resistance filaments of a non-ferromagnetic material having a low electrical resistivity, each low resistance filament being separated from the other low resistance filaments by a layer or cell of material having a higher electrical resistivity than that of the metal of the low resistance filaments, and each low resistance filament having a mean diameter not greater than one-fifth the mean diameter of said superconductor filament.

The superconductor filament may be formed of a plurality of filaments. Preferably less than 50% by weight of the matrix is constituted by the material of higher electrical resistivity. Preferably further this percentage is less than 10%.

Preferably also the resistivity of the material having the higher resistivity is at least 5 times, preferably at least 10 to 40 times, that of the metal of low resistivity. These proportions are taken at ambient temperatures such that if the composite material is used at very low temperatures, for example when cooled by liquid nitrogen or liquid helium, there may be a greater proportionality between the resistivities of the materials. In such a cooled environment, the resistivity of the metal having the higher resistivity may be at least 1000 times that of the metal of low resistivity. The material of higher electrical resistivity may be a metal or non-metallic insulator. If the higher resistivity material of the matrix is a metal, this can be in good electrical contact with the superconductor filament or group of subfilaments. If the higher resistivity material is a non-metallic insulator, preferably there is a good electrical contact between the superconductor filament or group of filaments and a plurality of low resistance filaments.

There is also provided a method of manufacturing a composite material of the type described above, in which there is assembled together a plurality of longitudinally extending superconductor elements or groups of filaments of a superconductive material, surrounding the superconductor elements with a matrix material comprising a plurality of longitudinally extending low resistance elements of a non-ferromagnetic metal having a low electrical resistivity with each low resistance element separated from the other low resistance elements by a layer of a material having a higher electrical resistivity than that of the metal of the low resistance elements and each low resistance element having a mean diameter not greater than one-fifth the mean diameter of said superconductor element or group of filaments, securing the assembly together and longitudinally extending the assembly to elongate the elements to produce corresponding filaments and to bond the components of the assembly securely together.

The high resistive material may be a metal and the components of the assembly may be secured together by metallurgically bonding the low resistance elements of low resistivity metal with the metal having a higher electrical resistivity and with the superconductor element.

The matrix material may be produced by having a low resistance element of the low resistivity metal, surrounding it with a layer of the high resistivity material to form assembly, longitudinally extending the assembly to secure the components thereof together, cutting the extended assembly into a number of lengths and stacking those lengths together to form said matrix material. Alternatively, said matrix material may be produced by stacking a number of tubes of a metal of higher resistivity, providing within each tube a low resistance element of the metal of low resistivity to produce a assembly and longitudinally extending the assembly to secure the components thereof together.

The longitudinal elongation may initially be carried out by extrusion; further extrusion may be carried out at an elevated temperature to provide a metallurgical bond between the components of the assembly.

The present invention also provides a method of producing a superconductor composite including the steps of:

i. preparing a can including a plurality of substantially alternate segments of a high electrical conductivity metal and a material of lower electrical conductivity, ii. inserting into the can a material or the components of a material having superconducting properties at cryogenic temperatures, and iii. extending the can longitudinally to elongate the components, and to bond the assembly securely together.

The material inserted may comprise a solid piece of a material or the components of a material having superconductive properties at cryogenic temperatures. Alternatively the material inserted may comprise a plurality of filaments of a material or the components of a material having superconducting properties at cryogenic temperatures, the filaments may be surrounded by a material of low electrical conductivity or a material of high electrical conductivity in a matrix of material of low electrical conductivity, or be filaments prepared by the route set out above. The assembly may be further elongated, cut into a plurality of lengths and bundled into a further can including a plurality of substantially alternate segments of a high electrical conductivity metal and a material of a lower conductivity, any spaces being filled with rods or filaments of material of a lower conductivity or a material of higher conductivity surrounded by material of a lower conductivity, the assembly being longitudinally extended to elongate the components and to bond the components together.

The cans at each or some of the stages may have a coating on the inside or the outside or both of a material having a lower electrical conductivity.

Preferably the material having a lower electrical conductivity is a metal, with mechanical properties sufficiently akin to the mechanical properties of the higher conductivity material to facilitate the elongation of the composites, for example by hot and/or cold working.

The can may be made by preparing a cylinder of the higher electrical conductivity material, forming, preferably by machining, a plurality of longitudinally extending slots in the outer or inner surface of the can, and inserting strips of a material of a lower conductivity in the slots.

The slots may be straight and extend radially or part chordally inwardly.

Alternatively, the can may be made by assembling a plurality of separate segments of a high electrical conductivity material, and a material of lower electrical conductivity, and joining the segments together. The segments may be joined together by extending them in an extrusion press.

The can may be sealed prior to the extension thereof, and the sealed can may be evacuated. The extension may be performed by extrusion, in which case a nose is welded to the can prior to the extrusion step.

The high electrical conductivity metal is preferably high conductivity copper (HC copper), or copper, or silver, or aluminium. The lower electrical conductivity material is preferably also metal. Suitable metals are cupro-nickels, with 2–40wt.% nickel, or low tin bronze or copper manganese silicon or brass alloys or phosphorus deoxidised copper.

The composite assembly may be twisted along a longitudinal axis whereby, except for any central filament, each filament follows a helical path.

BRIEF DESCRIPTION OF THE DRAWINGS

By way of example embodiments of the present invention will now be described with reference to the accompanying drawings, of which:

FIG. 1 is a perspective view of a sealed can;

FIG. 2 is a cross-section along the line II—II of FIG. 1;

FIG. 3 is a cross-section of an assembled composite;

Figure 5:
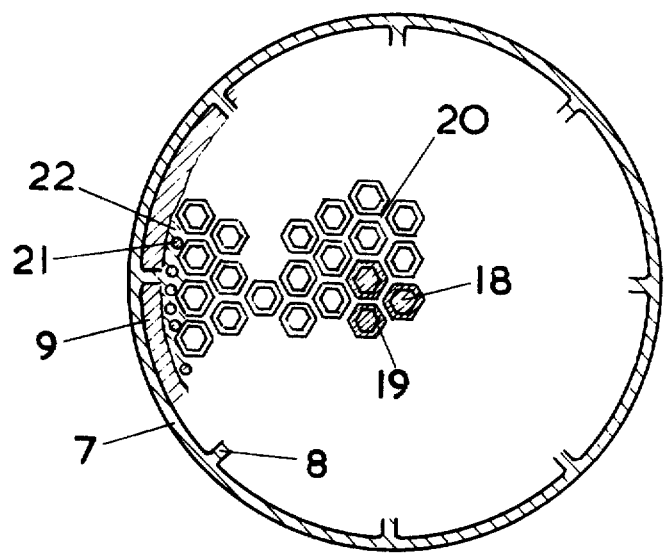
FIG. 5 is a cross-section of a further assembled composite.

1. To provide a thermal contact through which the superconductive filament can be cooled, 2. To provide electrical contact, through which electric current can be shunted in the event of a transient breakdown in superconductive properties of the filament, 3. To provide a mechanical support and location for the filaments, and 4. To facilitate electrical connections to the filaments at the ends of the composite.

However, the copper support, which extends across the whole width of the composite does provide a low resistance path in which eddy currents can develop.

By one embodiment of this invention, the low resistance paths are broken up by cupro-nickel barriers which extend transversely across the copper pathways. The cupro-nickel barriers extend longitudinally through the composite.

The basis of the method used to form these barriers is the treatment of the copper cans used in the formation of component filaments of the composite. The route used in forming a composite involves taking a phosphorous deoxidised copper can or a cupro-nickel can or a cupro-nickel coated copper can or a copper coated cupro-nickel extrusion can, filling it with a superconductor material already in composite form if required; sealing the can, extruding and drawing it down to wire; cutting the wire into lengths; stacking them in a further can; and then extruding and drawing the can to wire. These steps can be repeated as often as is required. In such a method, a thick-walled copper can 1 (FIG. 1) is machined from a billet of high conductivity copper having a high electrical resistance ratio ($\sigma 290°K/\sigma 4.2°K \geq 200$ where $\sigma$ 290°K = specific resistance at 290°K and $\sigma 4.2°K$ = specific resistance at 4.2°K). Longitudinal grooves or slots 2 which are spaced equally about the tube axis are milled into the outer surface of the tube. In this particular example, 16 grooves are milled into the surface. Cupro-nickel strips are rolled to the correct thickness, and edge milled in preparation for insertion into the slots. The front end of the can is machined to accommodate a copper nose piece 3 having an included apex angle in the range 60°–90°, preferably 90°. The back end of the can is machined to accommodate a copper end plug 4.

The cupro-nickel strips 5, having a composition 0.5 to 40wt.% nickel balance copper, but preferably in the range 8–20wt.% nickel balance copper, are pickled in acid and degreased, as is the can 1, and the strips are then pushed into the grooves 2. A cupro-nickel can of the same composition as the strips 5 is then prepared, pickled and degreased, and slid over the can 1 to form an outer sheath 6, shown dotted in FIG. 2. The nose plug 3 and back end plug 4 are electron beam welded on to the can 1 under vacuum, so that the interior of the can is then under vacuum.

The can is then pre-heated to a temperature in the range 450°–580°C, and extruded to give a tube shell. The ratio of the cross-sectional area before and after extrusion is preferably in the range 7:1 to 15:1. If the tube shell is needed to be of a further reduced diameter, it can be cold drawn through a series of dies, using a fixed plug to control the bore diameter. The sequence of operations imposed on the assembly effectively bonds the copper and the cupro-nickel together.

Once the extruded or extruded and drawn tube shell is prepared, it is machined to remove the copper from the bore of the tube, so that the segments of copper within the tube wall are isolated from one another. A rod of a suitable superconductive composite material such as niobium 44wt.% titanium in cupro-nickel is inserted into the tube shell, an end plate and nose plug are electron beam welded into place under vacuum, and the assembly is then extruded and drawn down to rod. The composite is a previously prepared assembly comprising a plurality of hexagonal niobium/titanium rods in a cupro-nickel matrix produced, for example, by the method described in British Patent No. 1,178,115. The rod is then given a final pass through a hexagonal die to give it a hexagonal cross-section. The rod is then cut into pieces and assembled into a further tube shell, with cupro-nickel covered copper wires used as packing pieces to fill in the spaces between the walls of the shell and the hexagonal composite rods. The final assembly is then extruded and drawn to wire to give the arrangement shown schematically in cross-section in FIG. 3, and in partial enlargement in FIG. 4.

Figure 4:
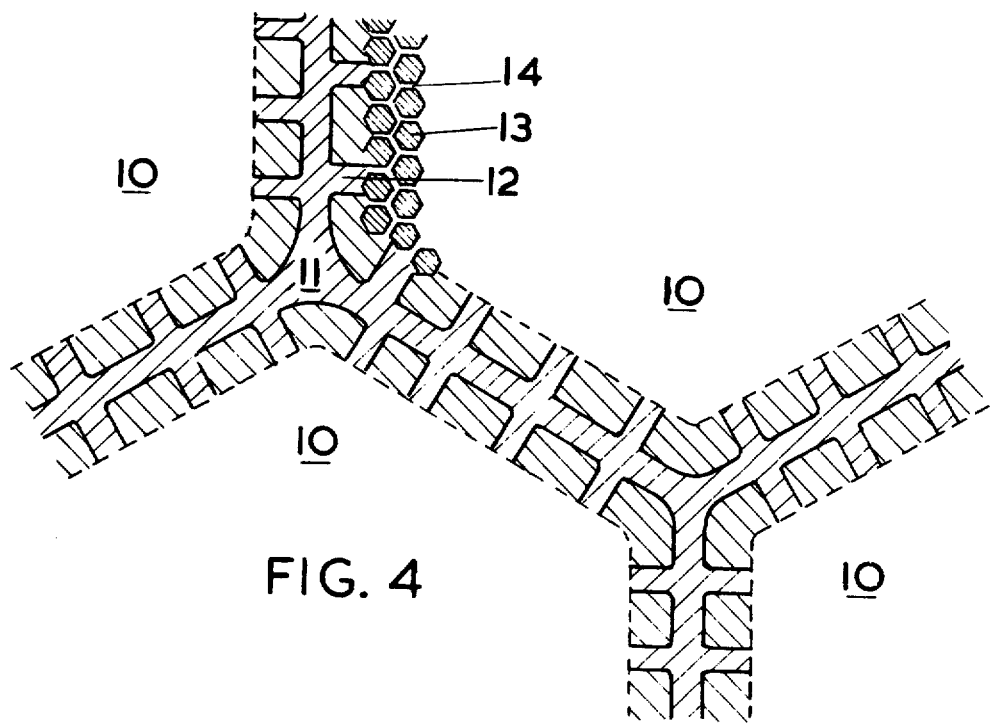
FIG. 4 is an enlarged sectional view of a part of the composite of FIG. 3.

In FIGS. 3 and 4, the wire has an external shell 7 of cupro-nickel, from which extend radially inwardly a plurality of longitudinal ribs 8, also of cupro-nickel. Between adjacent ribs is located a series of copper segments 9. In the central portion of the wire there is a plurality of sub-assemblies 10, each separated by a cupro-nickel shell, the shell 11 having cupro-nickel ribs extending inwardly towards the hexagonal superconductor filaments 13. The area 14 between the filaments 13 is occupied by cupro-nickel. Packing pieces 15 which are formed of copper wires 16 coated with cupro-nickel 17 occupy small spaces between the shell and the sub-assemblies 10. For reasons of clarity, the individual components of the wire are only shown in small quantities.

It will be appreciated that each superconductor filament 13 could be surrounded by a cupro-nickel shell and rib arrangement if required.

Referring to the arrangement illustrated in FIG. 5, a can formed in the manner described above has an outer ring 7 of cupro-nickel with cupro-nickel radial arms 8. Between the arms 8 are segments of copper 9. The central portion of the can is occupied by hexagonal superconductor filaments 18 surrounded by cells 19 of copper in a matrix 20 of cupro-nickel. Around the outside of the array are copper filaments 21 surrounded by cupro-nickel 22. To assemble the arrangement, a can is packed in the centre with hexagonal rods of superconductor surrounded by copper surrounded by cupro-nickel. The outer spaces are packed with copper rods in casings of cupro-nickel, and the whole assembly is then extruded and drawn to form the composite assembly illustrated in FIG. 5.

It can be seen that the arrangements disclosed in FIGS. 3, 4 and 5, although providing longitudinal electrically conductive paths do not permit high transverse eddy currents to develop, these eddy currents being blocked by the presence of the cupro-nickel shells and ribs.

For ease of working, the materials chosen should have as similar hardness and working characteristics as possible, whereas from the electrical point of view, the specific resistance of the barrier material at the cryogenic operating temperature should be as high as possible.

Although the invention has been specifically exemplified with reference to copper cupro-nickel and niobium-titanium superconductors, it will be appreciated that the invention is not to be limited to such materials. For example, aluminium or silver could be used in place of the copper. Any suitable material could be substituted for the cupro-nickel including an electrical insulator provided it had a sufficiently high thermal conductivity. The superconductor material may also be any suitable material, and may for example be an intermetallic compound, such as $Nb_3Sn$, in which case the components could be processed, and the components reacted after final drawing, or even after final assembly into the finished unit.

The resistivity of the material used to split up the conductivity high metal is preferably at least 5 and even more preferably at least 10 to 40 times the resistivity of the high conductivity metal. These proportions are at ambient temperatures, so that the proportionality at cryogenic temperatures, for example when cooled by liquid helium, may be at least 1000:1.

In a further embodiment of the invention a rod of high purity, high-conductivity copper is assembled within a tube of the alloy copper 30wt.% nickel, the assembly is evacuated and sealed, and it is then extruded at a temperature of 550°C to produce a copper bar clad with a metallurgically bonded sheath of cupro-nickel. The bar is drawn at ambient temperatures to produce a rod. The rod is cut into a number of lengths which are stacked together within an extrusion can of the same cupro-nickel alloy together with one or more rods of a superconductive material, the superconductive rods being spaced from one another by the cupro-nickel clad copper rods. The mean diameter of the copper core of the clad copper rods is arranged to be less than one-fifth the mean diameter of the superconductor rods. In this embodiment, the superconductor material is a niobium-titanium alloy, for example niobium 30–50wt.% titanium, preferably niobium 44wt.% titanium. The assembly is evacuated and sealed and after extrusion at 550°C, the components of the assembly are metallurgically bonded together with the superconductor filaments corresponding to each superconductor rod in intimate electrical contact with the layers of cupro-nickel alloy that arose from the cladding of the copper rods, and the contained copper filaments. The assembly can be drawn at room temperatures to the required size, the ratio between the diameters of the copper filaments and the superconductor filaments being maintained at less than one-fifth. The resulting composite is preferably twisted about its longitudinal axis with a twist pitch related to the rate of change of electrical field that the composite is expected to withstand when wound as a coil and used as a superconductor. The copper filaments provide, inter alia, an electrical shunt path through which can be transmitted the electrical current which would normally be carried by the superconductive filament, in case that filament be mechanically broken or electrically assume the condition of normal conductivity instead of superconductive conductivity. The low electrical conductivity of the layers of cupro-nickel minimises any transverse flow of induction current across the composite.

If there is required a composite containing a plurality of superconductor filaments, either there can be used the method referred to above in which a number of superconductor rods is provided in the assembly, or using a single superconductor rod, the resulting wire can be cut into a number of lengths which are stacked together in a further extrusion can which is subsequently evacuated and sealed, extruded at 550°C to metallurgically bond the components together, and drawn at room temperature to the required size. This process can be repeated if necessary.

In a modification of the typical embodiment, there is produced an annular assembly of cupro-nickel clad copper wires which is extruded and tube drawn to provide a tubular composite matrix material. This can be used either as an extrusion can for further assemblies of cupro-nickel clad copper rods and superconductor rods, or to contain a single superconductor rod for extrusion therewith to provide metallurgical bonding.

Figure 6:
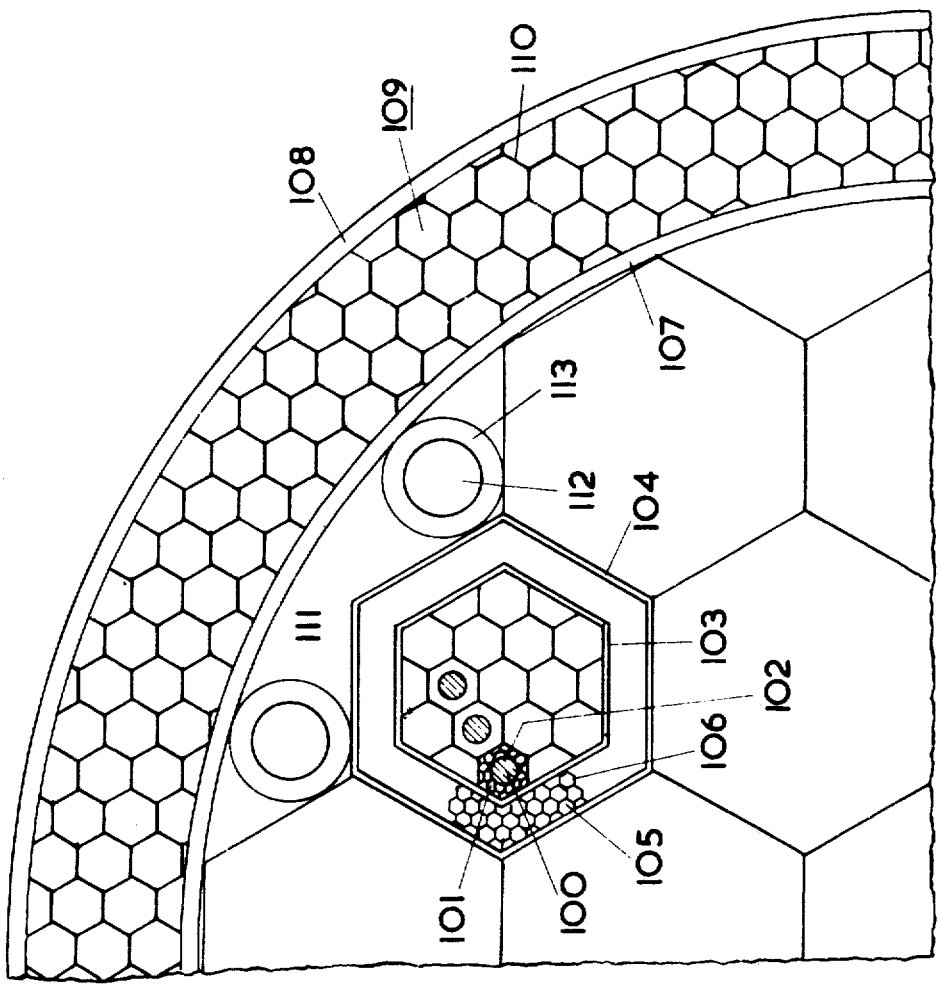
FIG. 6 is a partial cross-section of a further assembled composite.

In an alternative form of this latter embodiment, the superconductive rod is in the form of filaments of superconductive material in a matrix of normally conductive material. Thus in FIG. 6 a superconductor filament 100 is surrounded by a series of fine copper wires 101 in cupro-nickel sheaths 102, an array of the filaments being located in two cans of cupro-nickel 103 and 104 spaced apart by a series of copper wires 105 which are themselves coated in cupro-nickel 106. These cans are stacked together as illustrated in FIG. 6 and are located inside a further pair of cupro-nickel cans 107 and 108. Again the cans are spaced apart by copper wires 109 which are coated in cupro-nickel 110. Spaces in the can such as 111 which are not occupied by superconducting arrays such as that in can 104 are at least partially filled with copper wires 112 which are covered with cupro-nickel 113.

The assembly is manufactured in the same manner as the other arrangements described above. The assemblies of superconductor in a honeycomb matrix are produced by taking a billet of copper, inserting it into a can of cupro-nickel and warm extruding it to give cupro-nickel-clad copper rods which are given a hexagonal cross-section.

These rods can then be assembled in more than one way. They can be stacked inside a can of cupro-nickel, with a central core of copper if required, and a nose plug and an end plug electron beam welded into position. The can is then extruded at a temperature in the range 450°-570°C and then drawn to straighten the rod so formed. The rod is then cut into lengths, and the centre bored out to give a tube. The tube may then be lined with a cupro-nickel tube. Alternatively, the rods can be stacked inside the annular space between two concentric cupro-nickel cans of differing diameters, the cans then being sealed under vacuum, drawn to straighten the extruded rod and to obtain the desired size, and hexagonal shape, and then cut to length. Instead of using two concentric cupro-nickel tubes, a single can can be machined from a block of cupro-nickel which would be in the form of two concentric tubes joined by an annular "plate" at one end.

The hollow lengths of rod are then filled with a niobium 44wt.% titanium core, and extruded at a temperature in the range 450°-570°C to form a further honeycomb sheathed rod, which is then drawn to straighten it, and to give it a hexagonal shape, and is then cut into lengths. Lengths of these honeycomb sheathed rods can then be stacked into a further hollow tube having a honeycomb wall, and the assembly then extruded at a temperature range 450°-570°C and then drawn to give a further hexagonal sub-assembly which is cut into lengths. These lengths are then stacked into a further hollow tube having a honeycomb wall, with cupro-nickel or cupro-nickel sheathed copper rods as spacers if required. The final assembly is then extruded at a temperature in the range 450°-570°C and then drawn down to wire.

Figure 7:
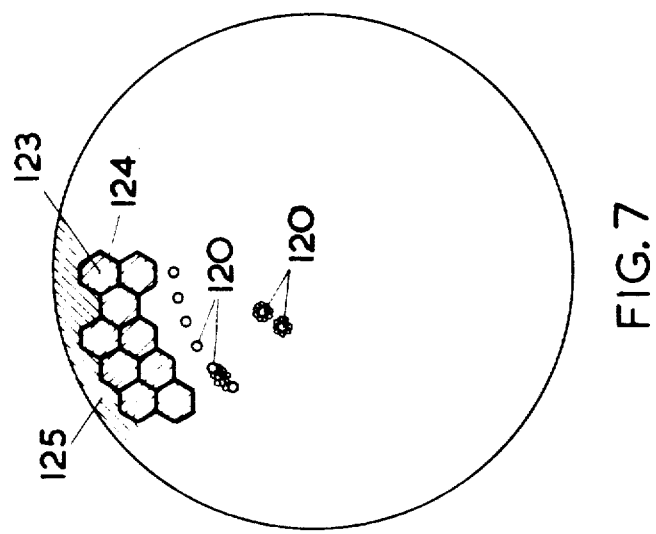
FIG. 7 is a partial cross-section of another assembled composite.
Figures 8, 9:
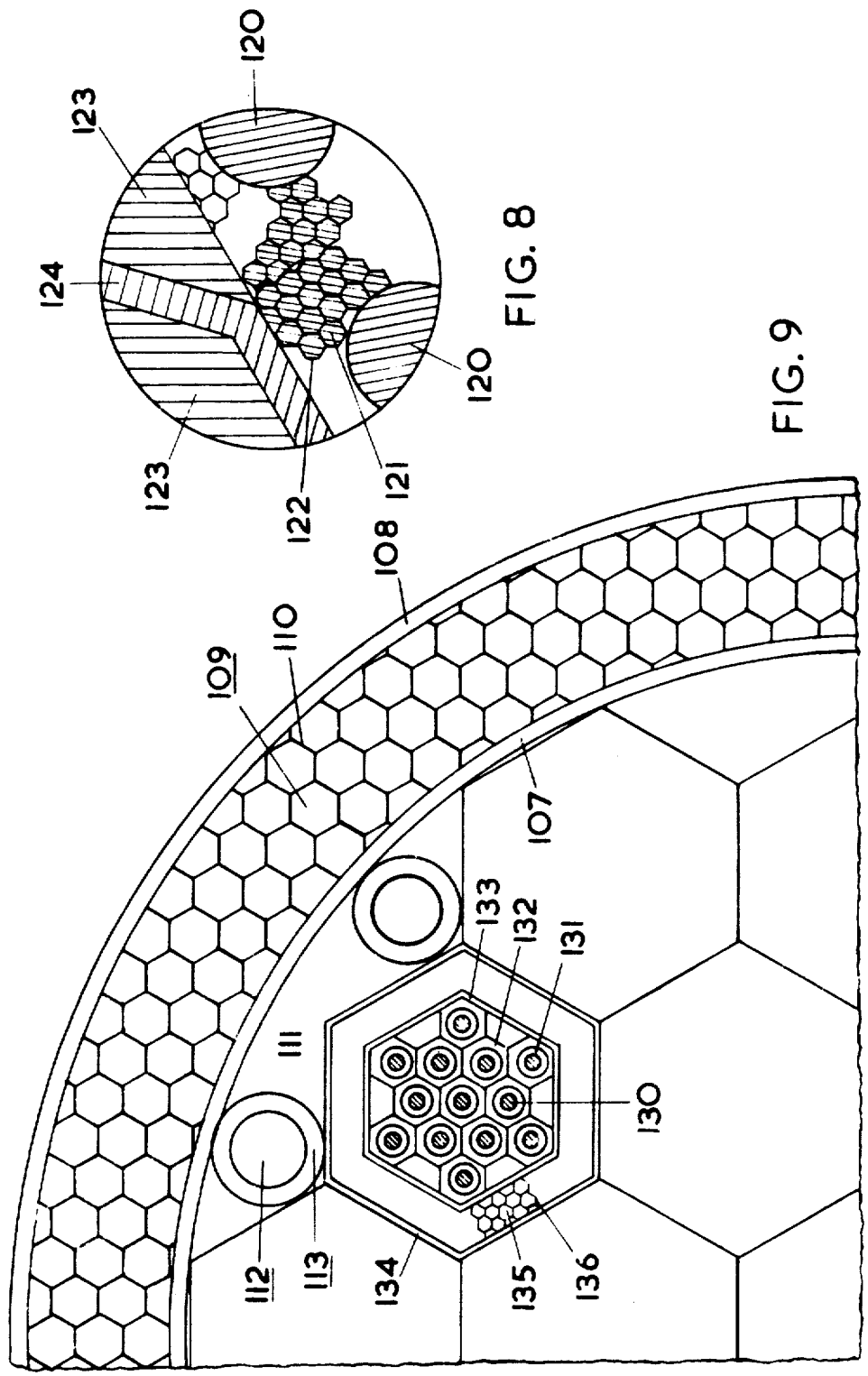
FIG. 8 is an enlarged view of a part of the embodiment of FIG. 7.
FIG. 9 is a partial cross-section of a further assembled composite. Description of the Preferred Embodiments The basic object is to prepare an assembled superconductive composite in which transverse low resistance paths in the composite are interrupted by relatively high resistance blockages, thus reducing transverse eddy currents in the composite when it is in use in an alternating or changing field. The composite needs to have a plurality of filaments of superconductive material, and the filaments must be in good thermal and electrical contact with a good conductor such as copper for four basic reasons.

Referring to FIGS. 7 and 8, a somewhat similar but slightly less complex arrangement is made by a similar extrusion assembly and final drawing route so that superconductor filaments 120 are surrounded by a series of copper filaments 121 each separated from one another by a cupro-nickel surround 122. The array of filaments 120 is surrounded by copper hexagonal rods 123 in a cupro-nickel matrix 124. The outside of the wire is a further layer of cupro-nickel 125. For reasons of clarity only part of the arrays in FIGS. 7 and 8 are illustrated.

In a still further embodiment of the invention, as illustrated in FIG. 9, an assembly similar to that illustrated in FIG. 6 is formed by extrusion and drawing. The embodiment has a bundle of filaments 130 each surrounded by a copper annulus 131, which is again circumferentially circumscribed by a cupro-nickel layer 132. It will be appreciated that the filaments could be surrounded by cupro-nickel only with no copper present. A bundle of the filaments is located inside a can formed as above and having a cupro-nickel inner wall 133 spaced from a cupro-nickel outer wall 134 by a series of hexagonal copper cells 135 in a cupro-nickel matrix 136. The cupro-nickel matrix which surrounds the copper has the effect of being a series of radially extending walls, albeit that they zig-zag outwardly. It should be noted that the term "radially extending" covers all cases where the walls extend from the inside cupro-nickel wall 133 to the outside wall 134. It is not necessary for the wall to extend along a radius, it could spiral out if required.

The assembly illustrated in FIG. 9 is otherwise similar to that illustrated in FIG. 6 and like parts have been given like reference numerals. Again for reasons of clarity only a small portion of the components have been illustrated.

In a modification of the embodiments, the copper 30wt.% nickel alloy can be replaced by other cupro-nickel alloys, the alloy copper 5–7wt.% tin 0.01–0.02wt.% phosphorus, copper 1wt.% manganese 3wt.% silicon, or copper 27.7wt.% zinc 1.02wt.% tin 0.02wt.% iron.

I claim:

1. A superconducting composite including bundles of longitudinally extending filaments,
    i. each bundle including longitudinally extending superconductor filaments
        a. each filament being surrounded by and in good electrical contact with a matrix material b. the matrix material comprising longitudinally extending cells of a metal of high electrical conductivity surrounded by a material of lower electrical conductivity c. the arrangement of the matrix material within the bundle being such that where at least two superconductor filaments are circumferentially circumscribed by a single annulus of the metal of high electrical conductivity, the annulus is electrically interrupted by a radially extending wall of the material of the lower electrical conductivity ii. the bundles being surrounded by and in good electrical contact with a further matrix material a. the further matrix material comprising longitudinally extending cells of a metal of high electrical conductivity surrounded by a material of lower electrical conductivity b. the arrangement of the further matrix material around the bundles being such that where at least two bundles are circumferentially circumscribed by a single annulus of the metal of high conductivity, the annulus is electrically interrupted by a radially extending wall of the material of the lower electrical conductivity.

2. The composite of claim 1 in which at least some of the filaments in a bundle are individually completely surrounded by an annular cell of the metal of high electrical conductivity, with material of high electrical conductivity, with material of the lower electrical conductivity completely circumferentially surrounding the annular cell of the metal of high electrical conductivity.

3. The composite of claim 1 in which the material of lower electrical conductivity is a metal.

4. A composite as claimed in claim 1 in which the matrix material comprises:

i. a plurality of longitudinal filaments of a non-ferromagnetic metal having a high electrical conductivity, each higher conductivity filament being separated from the other higher conductivity filaments by a layer or cell of material having a lower electrical conductivity than that of the metal of the higher conductivity filaments, and each higher conductivity filament having a mean diameter not greater than 1/5 the mean diameter of said superconductor filaments, and in which the further matrix material comprises ii. a plurality of longitudinal filaments of a non-ferromagnetic metal having a high electrical conductivity, each higher conductivity filament being separated from the other higher conductivity filaments by a layer or cell of material having a lower electrical conductivity than that of the metal of the higher conductivity filaments, and each higher conductivity filament having a mean diameter not greater than 1/5 the mean diameter of the said bundles.

5. The composite of claim 1 in which less than 50% by weight of each of the matrix material and the further matrix material is constituted by the material of lower conductivity.

6. The composite of claim 1 in which the conductivity of the material having the lower conductivity is less than 1/5 that of the conductivity of the metal of high conductivity taken at ambient temperature.

7. The composite of claim 1 in which the high electrical conductivity material is chosen from the group high conductivity copper, copper, silver or aluminium.

8. The composite of claim 1 in which the lower electrical conductivity material is chosen from the group cupro-nickels with 2 to 40% nickel, low tin bronze, copper-manganese-silicon alloys, brass alloys, or phosphorus deoxidized copper.

* * * * *